US010087351B2

(12) United States Patent
Bruzda et al.

(10) Patent No.: US 10,087,351 B2
(45) Date of Patent: *Oct. 2, 2018

(54) MATERIALS INCLUDING THERMALLY REVERSIBLE GELS

(71) Applicant: Laird Technologies, Inc., Earth City, MO (US)

(72) Inventors: Karen J. Bruzda, Cleveland, OH (US); Jason L. Strader, Cleveland, OH (US)

(73) Assignee: LAIRD TECHNOLOGIES, INC., Earth City, MO (US)

(*) Notice: Subject to any disclaimer, the term of this patent is extended or adjusted under 35 U.S.C. 154(b) by 0 days.

This patent is subject to a terminal disclaimer.

(21) Appl. No.: 15/714,425

(22) Filed: Sep. 25, 2017

(65) Prior Publication Data
US 2018/0079946 A1   Mar. 22, 2018

Related U.S. Application Data

(63) Continuation-in-part of application No. 15/043,808, filed on Feb. 15, 2016, now Pat. No. 9,771,508, which is a continuation-in-part of application No. 12/710,538, filed on Feb. 23, 2010, now Pat. No. 9,260,645.

(51) Int. Cl.
  C08G 18/08    (2006.01)
  C09K 5/14     (2006.01)
  H01L 23/42    (2006.01)
  H01L 23/427   (2006.01)
  C08L 91/00    (2006.01)
  H01L 23/00    (2006.01)

(52) U.S. Cl.
  CPC ............... C09K 5/14 (2013.01); C08L 91/00 (2013.01); H01L 23/42 (2013.01); H01L 23/4275 (2013.01); C08L 2203/206 (2013.01); C08L 2205/025 (2013.01); C08L 2205/03 (2013.01); C08L 2207/322 (2013.01); H01L 24/29 (2013.01); H01L 2224/2919 (2013.01); H01L 2224/2929 (2013.01); H01L 2224/29324 (2013.01); H01L 2224/29386 (2013.01)

(58) Field of Classification Search
  CPC ....... C08K 5/14; H01L 23/42; H01L 23/4275; H01L 2924/0002
  See application file for complete search history.

(56) References Cited

U.S. PATENT DOCUMENTS

| | | | |
|---|---|---|---|
| 4,798,853 A | 1/1989 | Handlin, Jr. | |
| 5,593,940 A | 1/1997 | Umise et al. | |
| 6,114,413 A | 9/2000 | Kang et al. | |
| 6,399,209 B1 | 6/2002 | Misra et al. | |
| 6,451,422 B1 | 9/2002 | Nguyen | |
| 6,475,962 B1 | 11/2002 | Khatri | |
| 6,673,434 B2 | 1/2004 | Nguyen | |
| 6,776,923 B2 | 8/2004 | Balian et al. | |
| 6,797,382 B2 | 9/2004 | Nguyen et al. | |
| 6,900,163 B2 | 5/2005 | Khatri | |
| 6,908,669 B2 | 6/2005 | Nguyen | |
| 6,998,089 B2 | 2/2006 | Osaki | |
| 7,038,009 B2 | 5/2006 | Sagal et al. | |
| 7,094,822 B2 | 8/2006 | Sagal et al. | |
| 7,147,367 B2 | 12/2006 | Balian et al. | |
| 7,244,491 B2 | 7/2007 | Nguyen | |
| 7,462,309 B2 | 12/2008 | Miller et al. | |
| 7,608,326 B2 | 10/2009 | Johnson | |
| 9,260,645 B2* | 2/2016 | Bruzda | C09K 5/14 |
| 9,771,508 B2* | 9/2017 | Bruzda | C09K 5/14 |
| 2003/0130398 A1 | 7/2003 | Wang | |
| 2003/0227959 A1* | 12/2003 | Balian | H01L 23/3736 374/161 |
| 2007/0097651 A1 | 5/2007 | Canale et al. | |
| 2007/0241307 A1 | 10/2007 | Nguyen | |
| 2008/0171199 A1 | 7/2008 | Song et al. | |
| 2011/0214284 A1 | 9/2011 | Xu et al. | |
| 2012/0080639 A1 | 4/2012 | Bruzda et al. | |

FOREIGN PATENT DOCUMENTS

| | | |
|---|---|---|
| WO | WO-2010117480 A2 | 10/2010 |
| WO | WO-2011106238 A2 | 9/2011 |

OTHER PUBLICATIONS

International Search Report and Written Opinion dated Oct. 21, 2011 from PCT/US2011/025294 (now WO 2011/106238) which is the parent application to the instant application; 11 pages.

* cited by examiner

Primary Examiner — Robert D. Harlan
(74) Attorney, Agent, or Firm — Harness, Dickey & Pierce, P.L.C.; Anthony G. Fussner

(57) ABSTRACT

Materials are disclosed that include or are based on thermally reversible gels, such as thermally reversible gelled fluids, oil gels and solvent gel resins. In an exemplary embodiment, a material includes at least one filler in a thermally reversible gel.

24 Claims, No Drawings

MATERIALS INCLUDING THERMALLY REVERSIBLE GELS

CROSS-REFERENCE TO RELATED APPLICATION

This application is a continuation-in-part of U.S. patent application Ser. No. 15/043,808 filed Feb. 15, 2016 (published as US2016/0160104 on Jun. 9, 2016, issuing on Sep. 26, 2017 as U.S. Pat. No. 9,771,508) which, in turn, is a continuation-in-part of U.S. patent application Ser. No. 12/710,538 filed Feb. 23, 2010 (now U.S. Pat. No. 9,260,645 issued on Feb. 16, 2016). The entire disclosures of the above applications are incorporated herein by reference in its entirety.

FIELD

The present disclosure relates generally to materials including or based on thermally reversible gels, such as thermally reversible gelled fluid, oil gel and solvent gel resins.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material. The thermal interface material may be used to fill the gap between thermal transfer surfaces, in order to increase thermal transfer efficiency as compared to having the gap filled with air, which is a relatively poor thermal conductor. Most especially in the cases of phase changes and thermal greases, a significant gap is not required and the purpose of the thermal interface material may be just to fill in the surface irregularities between contacting surfaces. In some devices, an electrical insulator may also be placed between the electronic component and the heat sink, in many cases this is the thermal interface material itself.

DETAILED DESCRIPTION

Example embodiments will now be described more fully. Many thermal interface materials are based on silicone resin systems. But in some applications, a silicone-free thermal interface compliant gap filler is desired, such as for fiber optic applications, automotive modules, disk drives, plasma display panels, liquid crystal display panels, etc. Ideally, silicone free thermal interface materials would not only be silicone free, but they would also be extremely soft, elastomeric, of reasonable cost, temperature and atmospherically stable, and free of significant resin migration. But silicone free thermally-conductive gap fillers are often based on acrylic, polyurethane, polyolefin, etc. resin systems, which suffer from the fact that they produce a relatively hard elastomer, resulting in a non-compliant gap filler. After recognizing the above, the inventor hereof has developed and now discloses various exemplary embodiments of silicone-free, compliant thermal interface materials that include or are based on thermally reversible gels, such as thermally reversible gelled fluids, oil gels and solvent gel resins. In addition, the inventor hereof has also developed and discloses herein other exemplary embodiments of thermal interface materials that include or are based on thermally reversible gels, some of which may be silicone-based gels. Accordingly, while some exemplary embodiments disclosed herein are entirely or substantially free of silicone, other exemplary embodiments may include silicone. In the embodiments that are substantially free of silicone, a thermal interface material may include a de minimis or trivial amount of silicone, where that amount of silicone is low enough so as to not adversely affect the end use applications of the thermal interface material, which might otherwise be adversely affected by the presence of a more than trivial amount of silicone. Some embodiments of a thermal interface material are based on an oil gel resin system and are silicone free (e.g., entirely silicone free, substantially silicone free), extremely soft, elastomeric, of reasonable cost, temperature and atmospherically stable and free of significant resin migration.

By way of background, the term "gel" as used herein may generally refer to semi-rigid colloidal dispersion of a solid with a liquid or gas, as jelly, glue, etc. A "gel" may generally be a solid, jelly-like material that can have properties ranging from soft and weak to hard and tough. "Gel" as used herein may be defined as a substantially dilute elastic or micelle network that exhibits no flow when in the steady-state. By weight, a gel may be mostly liquid, yet they behave like solids due to a three-dimensional network within the liquid. It is the network within the liquid that gives gel its structure (hardness). With a gel, a solid three-dimensional network generally spans the volume of a liquid medium. By way of further background, "a thermally reversible gel" as used herein refers to a gel that may be heated to a liquid and cooled to a gel over and over again, such that the thermally reversible gel may thus be reused, reformed, recycled, etc. by reheating the gel to a liquid and cooling back to a gel. In some cases, this transition temperature at which the thermally reversible gel changes from substantially liquid to a gel may be below room temperature.

As recognized by the inventor hereof, thermally reversible gels, such as thermally reversible gelled fluids, oil gels and solvent gel resins, are well suited for use as a base for thermal interface materials. Accordingly, the inventor has disclosed herein example embodiments of novel thermal interface materials and methods of making such novel thermal interface materials that include or are based on thermally reversible gels, such as thermally reversible gelled fluids, oil gels and solvent gel resins. The thermal interface materials may also include at least one thermally conductive filler in the thermally reversible gel.

Also, the inventor has recognized that thermally reversible gels, such as oil gels, may be specifically formulated to soften at a given temperature. This, in turn, may allow for greater customization for some of the inventor's exemplary embodiments of thermal interface materials that are based on oil gel resin systems as compared to some thermal interface materials based on a silicone resin system. For example, some of the inventor's exemplary embodiments provide thermal interface materials based on oil gel resin systems in which the oil gel has been selected or formulated such that the thermal interface material begins to soften at a temperature of about 150 degrees Celsius. In other embodiments, a thermal interface material may include an oil gel resin system in which the oil gel is formulated to soften at a temperature higher or less than 150 degrees Celsius, such as within a temperature from about 5 degrees Celsius to about 200 degrees Celsius.

In various exemplary embodiments, thermally conductive filler is added to oil (or other gellable fluid) and gelling agent to produce a thermally conductive grease, phase change, putty, and/or gap filler. By using an oil gel (or other suitable thermally reversible gel) as the base for a thermal interface material, the inventor hereof has discovered that it is possible to produce a gap filler with physical properties comparable to that of traditional silicone based gap filler yet with no occurrence of silicone migration or volatility due to the absence of silicone in the formulation.

A thermally reversible gel is generally a blend of one or more oils and/or solvents and one or more gelling agents. The majority of the blend typically comprises the oil(s) and/or solvent(s). Suitable oils or other materials for a thermally reversible gel that may be used in exemplary embodiments of the present disclosure include naphthenic oils, paraffinic oils, iso-paraffinic oils, hydrocarbon oils, aromatic oils, paraffinic solvents, isoparaffinic solvents (e.g., Isopar), naphthenic solvents, silicone oils, etc., mineral oils, natural oils (such as soybean oils, coconut oils and ester oils) and synthetic products (such as polybutene or polyisobutene). Suitable gelling agents that may be used in exemplary embodiments of the present disclosure include waxes, fumed silica, fatty acid soaps, thermoplastic materials (e.g., thermoplastic elastomers, etc.) and polymers (e.g., block copolymers, etc.). Oil gels are commonly used for air fresheners, candles, cable fillers, sealants, lubricating greases, strippable coatings, corrosion protectors, etc. But oil gels have not been used as a base for thermal interface materials. Exemplary embodiments of the present disclosure may vary the type and quantities of the thermally reversible gels included in a thermal interface material. By way of example, thermal interface materials disclosed herein may include a wide range of different types and quantities of thermally reversible gels with a di-block and/or tri-block copolymer(s) (e.g., di-block styrenic copolymers, tri-block styrenic copolymers, etc.), oils and/or solvents blended with elastomers (e.g., thermoplastic elastomers, etc.), gelling agents, etc. One or more of these above-listed materials may be selected for various exemplary embodiments of the present disclosure and then varied to produce particular gels (e.g., thermally reversible gelled fluids, oil gel and solvent gel resin, etc.) with different characteristics for a given thermal interface material.

For example, depending on the specific ingredients and formulation, a resulting oil gel may vary from a cohesive highly elastic continuous rubber network, to a weak gel, to a grease. Accordingly, thermal interface materials of the present disclosure may include any of wide range of thermally reversible gels, so as to be configured to provide one or more of thermally conductive gap fillers, thermally conductive gels, thermally conductive putties, thermally conductive dispensable materials, and thermally conductive greases. In various exemplary embodiments, the thermal interface material may have a hardness less than or equal to about 100 Shore A. Furthermore, some thermal interface materials based on oil gel may also be formulated to soften at a given temperature (e.g., at 150 degrees Celsius, etc.), function as phase change materials, etc.

In example embodiments of the present disclosure in which the thermal interface material includes oil gel, the oil gel may comprise process oil and a gelling agent. Process oils are typically oils for which one or more key properties are reported and controlled. Process oils and/or solvents are typically used in manufacturing to modify the properties of an article, improve the properties of an article, and/or impart desired properties to a finished article.

Example embodiments of thermal interface materials of the present disclosure may include naphthenic oils and solvents and/or paraffinic oils and solvents (e.g., isopars, etc.). Temperature stability of the oil and/or solvent is one example characteristic to be considered when selecting the oil/solvent for a thermal interface material of the present disclosure. Because thermal interface materials may be exposed to varying, and relatively high, temperatures, in some embodiments a high temperature stable oil and/or solvent may be desirable.

Thermal interface materials according to the present disclosure may use thermoplastic materials (e.g., thermoplastic elastomers, etc.) for the gelling agent of the oil gel. Suitable thermoplastic materials include block copolymers, such as di-block and tri-block polymers (e.g., di-block and tri-block styrenic polymers, etc.). Some exemplary embodiments of a thermal interface material include block polymers comprising polystyrene segments and rubber segments. With di-block polymers, a polystyrene segment is attached to a rubber segment, while tri-block polymers include polystyrene segments on both ends of a rubber segment. In oils gels made with tri-block styrenic polymers, the styrene segments act as physical crosslinks with the rubber to form a highly elastic continuous rubber network. Di-block polymers, however, do not form such physical crosslinks and an oil gel made with di-block polymers tends to resemble a grease rather than a solid rubber. Di-block and tri-block polymers may be used alone or together in various proportions according to the desired characteristics for the thermal interface material that will include the same. The rubber is the elastomeric portion of such polymers and may be, for example, a saturated olefin rubber (such as polyethylene/butylene, polyethylene/propylene, etc.).

One or more thermally conductive fillers are added during processing to create a thermally conductive interface material in which one or more thermally conductive fillers will be suspended in, added to, mixed into, etc. the thermally reversible gel. For example, at least one thermally conductive filler may be added to a mixture including gellable fluid and gelling agent before the gellable fluid and gelling agent have gelled or form the thermally reversible gel. As another example, at least one thermally conductive filler may be added to the gellable fluid and then gelling agent may be added to the mixture containing gellable fluid and thermally conductive filler. In yet another example, at least one thermally conductive filler may be added to the gelling agent and then gellable fluid may be added to the mixture containing gelling agent and thermally conductive filler. By way of further example, at least one thermally conductive filler may be added after the gellable fluid and gelling agent have gelled. For example, at least one thermally conductive filler may be added to the gel when the gel may be cooled and be loosely networked such that filler can be added. The amount of thermally conductive filler in the thermally reversible gel may vary in different embodiments. By way of example, some exemplary embodiments of a thermal interface material may include not less than 5 percent but not more than 98 percent by weight of at least one thermally conductive filler.

A wide range of different thermally conductive fillers may be used in exemplary embodiments of a thermal interface material according to the present disclosure. In some preferred embodiments, the thermally conductive fillers have a thermal conductivity of at least 1 W/mK (Watts per meter-Kelvin) or more, such as a copper filler having thermally conductivity up to several hundred W/mK, etc. Suitable thermally conductive fillers include, for example, zinc oxide, boron nitride, alumina, aluminum, graphite, ceramics, combinations thereof (e.g., alumina and zinc oxide, etc.). In addition, exemplary embodiments of a thermal interface material may also include different grades (e.g., different sizes, different purities, different shapes, etc.) of the same (or different) thermally conductive fillers. For example, a thermal interface material may include two different sizes of boron nitride. By varying the types and grades of thermally conductive fillers, the final characteristics of the thermal interface material (e.g., thermal conductivity, cost, hardness, etc.) may be varied as desired.

Other suitable fillers and/or additives may also be added to a thermal interface material to achieve various desired outcomes. Examples of other fillers that may be added include pigments, plasticizers, process aids, flame retardants, extenders, electromagnetic interference (EMI) or microwave absorbers, electrically-conductive fillers, magnetic particles, etc. For example, tackifying agents, etc. may be added to increase the tackiness of a thermal interface material, etc.

As another example, EMI or microwave absorbers, electrically-conductive fillers, and/or magnetic particles may be added such that the thermal interface material may be operable or usable as an EMI and/or RFI shielding material. A wide range of materials may be added to a thermal interface material according to exemplary embodiments, such as carbonyl iron, iron silicide, iron particles, iron-chrome compounds, metallic silver, carbonyl iron powder, SENDUST (an alloy containing 85% iron, 9.5% silicon and 5.5% aluminum), permalloy (an alloy containing about 20% iron and 80% nickel), ferrites, magnetic alloys, magnetic powders, magnetic flakes, magnetic particles, nickel-based alloys and powders, chrome alloys, and any combinations thereof. Other embodiments may include one or more EMI absorbers formed from one or more of the above materials where the EMI absorbers comprise one or more of granules, spheroids, microspheres, ellipsoids, irregular spheroids, strands, flakes, powder, and/or a combination of any or all of these shapes. Accordingly, some exemplary embodiments may thus include thermal interface materials that include or are based on thermally reversible gels, where the thermal interface materials are also configured (e.g., include or are loaded with EMI or microwave absorbers, electrically-conductive fillers, and/or magnetic particles, etc.) to provide shielding.

By way of background, EMI absorbers convert electromagnetic energy into another form of energy through a process commonly referred to as a loss. Electrical loss mechanisms include conductivity losses, dielectric losses, and magnetization losses. Conductivity losses refer to a reduction in EMI resulting from the conversion of electromagnetic energy into thermal energy. The electromagnetic energy induces currents that flow within the EMI absorbers having a finite conductivity. The finite conductivity results in a portion of the induced current generating heat through a resistance. Dielectric losses refer to a reduction in EMI resulting from the conversion of electromagnetic energy into mechanical displacement of molecules within the EMI absorbers having a non-unitary relative dielectric constant. Magnetic losses refer to a reduction in EMI resulting from the conversion of electromagnetic energy into a realignment of magnetic moments within the EMI absorbers.

In some exemplary embodiments, a thermal interface material may include an adhesive layer. The adhesive layer may be a thermally conductive adhesive to preserve the overall thermal conductivity. The adhesive layer may be used to affix the thermal interface material to an electronic component, heat sink, EMI shield, etc. The adhesive layer may be formulated using a pressure-sensitive, thermally-conducting adhesive. The pressure-sensitive adhesive (PSA) may be generally based on compounds including acrylic, silicone, rubber, and combinations thereof. The thermal conductivity is enhanced, for example, by the inclusion of ceramic powder.

In some exemplary embodiments, thermal interface materials including thermally-reversible gel may be attached or affixed (e.g., adhesively bonded, etc.) to one or more portions of an EMI shield, such as to a single piece EMI shield and/or to a cover, lid, frame, or other portion of a multi-piece shield, to a discrete EMI shielding wall, etc. Alternative affixing methods can also be used such as, for example, mechanical fasteners. In some embodiments, a thermal interface material that includes thermally-reversible gel may be attached to a removable lid or cover of a multi-piece EMI shield. A thermal interface material that includes thermally-reversible gel may be placed, for example, on the inner surface of the cover or lid such that the thermal interface material will be compressively sandwiched between the EMI shield and an electronic component over which the EMI shield is placed. Alternatively, a thermal interface material that includes thermally-reversible gel may be placed, for example, on the outer surface of the cover or lid such that the EMI shield is compressively sandwiched between the EMI shield and a heat sink. A thermal interface material that includes thermally-reversible gel may be placed on an entire surface of the cover or lid or on less than an entire surface. A thermal interface material that includes thermally-reversible gel may be applied at virtually any location at which it would be desirable to have an EMI absorber.

Aspects of the present disclosure will be further illustrated by the following examples. The following examples are merely illustrative, and do not limit this disclosure to the particular formulations in any way.

EXAMPLES

Example 1

In this example, a thermal interface material (specifically a thermally-conductive gap filler) including one or more aspects of the present disclosure was generally formed from di-block and tri-block styrenic copolymers, a paraffinic oil, and thermally conductive fillers.

In this example thermal interface material, the oil is about 14.1 percent of the thermal interface material by weight, the di-block styrenic copolymer is about 4.2 percent of the thermal interface material by weight, the tri-block styrenic copolymer is about 1.1 percent of the thermal interface material by weight, and the thermally conductive fillers are about 80.2 percent of the thermal interface material by weight. The thermal interface material also includes an antioxidant that is about 0.1 percent of the thermal interface material by weight and pigment that is about 0.4 percent of the thermal interface material by weight.

The tri-block styrenic copolymer used in this example formulation includes polyethylene/butylene as the elastomeric (or rubber) portion. The structure is predominantly tri-block and has a styrene to rubber ratio of 29 to 71. The copolymer has a medium molecular weight and a glass transition temperature of −55° C.

The di-block styrenic copolymer used in this example formulation includes polyethylene/propylene as the elastomeric (or rubber) portion. The structure is predominantly di-block and has a styrene to rubber ratio of 37 to 63. The copolymer has a high molecular weight and a glass transition temperature of −55° C.

For this example formulation, the thermally conductive filler included two different grades of alumina. The first grade of alumina is ground aluminum oxide with mean particle size of 2 microns and is about 15.6 percent of the thermal interface material by weight. The second grade of alumina is a generally spherical aluminum oxide with a mean particle size of 30 microns and is about 64.3 percent of the thermal interface material by weight.

This example thermal interface material exhibited a thermal conductivity of 0.9 W/mK (as measured according to the Hot Disk method). The thermal interface material exhibited a hardness of about 48 Shore 00 (three seconds, as measured according to ASTM standard D2240-00).

An exemplary process will now be described, which may be used for preparing a thermal interface material consistent with this Example 1. Alternative processes, however, may also be employed for making a thermal interface material. In this example, the oil, the di-block styrenic copolymer, the tri-block styrenic copolymer, pigment and antioxidant may be mixed together to get a homogenized mixture. The mixture may then be heated to soften the polystyrene segments of the di-block styrenic copolymer and the tri-block styrenic copolymer, freeing them to move with shear. The mixture may then be maintained at about 150° C. for two to three hours with mixing until the mixture achieves a smooth consistency. The thermally conductive fillers may then be added to the mixture, resulting in a mixture having the consistency of wet sand. The mixture may then be cooled to a rubber consistency. Rather than immediately adding the thermally conductive fillers, the thermally conductive fillers may be added later. For example, the homogenized mixture or resin may be cooled and stored before any thermally conductive fillers are added. After a time, the homogenized mixture or resin may be re-heated and then the thermally conductive fillers may be added. After which, the mixture including the thermally conductive fillers is cooled to a rubber consistency.

After the mixture with the thermally conductive fillers therein is cooled to a rubber consistency and while warm, the mixture may then be processed for use as a thermal interface material. In this Example 1, the warm mixture may be formed, etc. into sheets of material with release liners (e.g., for protection of the formed thermal interface material during cutting, shipping, etc.) added to both sides of the sheets for final distribution. Alternatively, it should be appreciated that the warm mixture could be allowed to cool (by suitable cooling operations) after the fillers are added, stored for later use, and then subsequently re-warmed to be processed into thermal interface materials. The mixture may be formed into a thermal interface material sheet by calendaring the mixture between two liner sheets. The nip (or gap) between a series of heated rollers may be set to the desired thickness of the final thermal interface material. The mixture may then be run through the rollers to form a pad with a thickness as determined by the gap between the rollers. Simultaneously, liner sheets may be run through the rollers on either side of the mixture/thermal interface material resulting in a finished thermal interface material that includes release liners on both sides of the thermal interface material. The release liners may be any suitable release liner, for example, Mylar liners. Alternatively, the release liner may only be located on one side of the thermal interface material, or there may be no release liner applied to the thermal interface material.

In some other exemplary embodiments such as those in which the thermally-reversible gel is of very low hardness or grease-like at room temperature (or a cooled state), the gel might not have to be heated to add the filler. Instead, the room-temperature or cool gel may be of low enough viscosity that the gel does not need to be liquefied by heat to add filler. The gel may be substantially liquid enough at room temperature or even in a cooled state to allow for the addition of one or more fillers to the gel.

A thermal interface material may also be molded, such as by injection molding, instead of being calendared. Injection molding may permit three dimensionally shaped thermal interface materials to be created.

After the thermal interface material sheet has been calendared, it is ready for use or further processing. The completed thermal interface material sheet may be further processed in a manner similar to other thermal interface materials. For example, the thermal interface material sheet may be cut into smaller sheets, die-cut into specific shapes, laser cut, etc.

Thermal interface materials according to the present disclosure may be reused/reformed/recycled/etc. by reheating the material, which is unlike for example, various known thermal interface materials that are not based on thermally reversible gels. Accordingly, a thermal interface material based on a thermally reversible gel may be reheated and reprocessed (e.g., reshaped, re-sized, etc.) in the manner described above.

Example 2

In this example, a thermal interface material including one or more aspects of the present disclosure was generally formed from a di-block styrenic copolymer, a tri-block and di-block styrenic copolymer blend, paraffinic oil, and thermally conductive fillers.

In this example thermal interface material, the oil is about 13.5 percent of the thermal interface material by weight, the di-block styrenic copolymer is about 1.7 percent of the thermal interface material by weight, the di-block/tri-block copolymer blend is about 3.4 percent of the thermal interface material by weight, and the thermally conductive fillers are about 81 percent of the thermal interface material by weight. The thermal interface material also includes an antioxidant that is about 0.1 percent of the thermal interface material by weight and pigment that is about 0.3 percent of the thermal interface material by weight.

The di-block styrenic copolymer used in this example formulation includes polyethylene/propylene as the elastomeric (or rubber) portion. The structure is predominantly di-block and has a styrene to rubber ratio of 37 to 63. The copolymer has a high molecular weight and a glass transition temperature of −55° C.

The di-block/tri-block styrenic copolymer blend used in this example formulation includes polyethylene/butylene as the elastomeric (or rubber) portion. The blend is 30 percent tri-block and 70 percent di-block and has a styrene to rubber ratio of 30 to 70. The copolymer blend has a low molecular weight and a glass transition temperature of −55° C.

For this example formulation, the thermally conductive filler included two different thermally conductive fillers. The first thermally conductive filler is a ground alumina trihydrate (ATH) with mean particle size of 20 microns and is about 72.5 percent of the thermal interface material by weight. The second thermally conductive filler is a fine zinc oxide (ZnO) with a mean particle size of 0.3 microns and is about 8.5 percent of the thermal interface material by weight.

The thermal interface material of this example may be prepared and processed as described above in regard to Example 1.

This example thermal interface material exhibited a thermal conductivity of 1.53 W/mK (as measured according to the Hot Disk method). The thermal interface material exhibited a hardness of about 75 Shore 00 (three seconds, as measured according to ASTM standard D2240-00).

Example 3

In this example, a thermal interface material including one or more aspects of the present disclosure was generally formed from a di-block styrenic copolymer, a tri-block styrenic copolymer, paraffinic oil, and boron nitride fillers.

In this example thermal interface material, the oil is about 43.2 percent of the thermal interface material by weight, the di-block styrenic copolymer is about 2.9 percent of the thermal interface material by weight, the tri-block copolymer is about 6.7 percent of the thermal interface material by weight, and the thermally conductive filler is about 46.1 percent of the thermal interface material by weight. The thermal interface material also includes an antioxidant that is about 0.2 percent of the thermal interface material by weight and pigment that is about 1 percent of the thermal interface material by weight.

The tri-block styrenic copolymer used in this example formulation includes polyethylene/butylene as the elastomeric (or rubber) portion. The structure is predominantly tri-block and has a styrene to rubber ratio of 29 to 71. The copolymer has a medium molecular weight and a glass transition temperature of −55° C.

The di-block styrenic copolymer used in this example formulation includes polyethylene/propylene as the elastomeric (or rubber) portion. The structure is predominantly di-block and has a styrene to rubber ratio of 37 to 63. The copolymer has a high molecular weight and a glass transition temperature of −55° C.

For this example formulation, the thermally conductive filler included boron nitride with a mean particle size of 125 microns.

The thermal interface material of this example may be prepared and processed as described above in Example 1.

This example thermal interface material exhibited a thermal conductivity of 2.7 W/mK (as measured according to the Hot Disk method). The thermal interface material exhibited a hardness of about 80 Shore 00 (three seconds, as measured according to ASTM standard D2240-00).

Example 4

In this example, a thermal interface material (specifically thermal grease) including one or more aspects of the present disclosure was generally formed from a di-block styrenic copolymer, paraffinic oil, and a boron nitride filler.

In this example thermal interface material, the oil is about 51.3 percent of the thermal grease by weight, the di-block styrenic copolymer is about 33.3 percent of the thermal grease by weight, and the thermally conductive filler is about 15.4 percent of the thermal grease by weight.

The di-block styrenic copolymer used in this example formulation includes polyethylene/propylene as the elastomeric (or rubber) portion. The structure is predominantly di-block and has a styrene to rubber ratio of 37 to 63. The copolymer has a high molecular weight and a glass transition temperature of −55° C.

For this example formulation, the thermally conductive filler included boron nitride with a mean particle size of 210 microns.

This example thermal grease exhibited a thermal conductivity of 0.8 W/mK (as measured according to the Hot Disk method). As this example thermal interface material is a grease, it has no measureable hardness.

Example 5

In this example, a thermal interface material including one or more aspects of the present disclosure was generally formed from a di-block styrenic copolymer, a tri-block styrenic copolymer, paraffinic oil, and a boron nitride filler.

In this example thermal interface material, the oil is about 42.4 percent of the thermal interface material by weight, the di-block styrenic copolymer is about 2.8 percent of the thermal interface material by weight, the tri-block copolymer is about 6.6 percent of the thermal interface material by weight, and the thermally conductive filler is about 47.1 percent of the thermal interface material by weight. The thermal interface material also includes an antioxidant that is about 0.2 percent of the thermal interface material by weight and pigment that is about 0.9 percent of the thermal interface material by weight.

The tri-block styrenic copolymer used in this example formulation includes polyethylene/butylene as the elastomeric (or rubber) portion. The structure is predominantly tri-block and has a styrene to rubber ratio of 29 to 71. The copolymer has a medium molecular weight and a glass transition temperature of −55° C.

The di-block styrenic copolymer used in this example formulation includes polyethylene/propylene as the elastomeric (or rubber) portion. The structure is predominantly di-block and has a styrene to rubber ratio of 37 to 63. The copolymer has a high molecular weight and a glass transition temperature of −55° C.

For this example formulation, the thermally conductive filler included boron nitride with a mean particle size of 125 microns.

The thermal interface material of this example may be prepared and processed as described above in Example 1.

This example thermal interface material exhibited a thermal conductivity of 3.37 W/mK (as measured according to the Hot Disk method). The thermal interface material exhibited a hardness of about 88 Shore 00 (three seconds, as measured according to ASTM standard D2240-00).

Example 6

In this example, a thermal interface material including one or more aspects of the present disclosure was generally formed from a di-block styrenic copolymer, a tri-block/di-block styrenic copolymer blend, paraffinic oil, and thermally conductive fillers.

In this example thermal interface material, the oil is about 42.5 percent of the thermal interface material by weight, the di-block styrenic copolymer is about 5.3 percent of the thermal interface material by weight, the di-block/tri-block copolymer blend is about 10.6 percent of the thermal interface material by weight, and the thermally conductive fillers are about 40.3 percent of the thermal interface material by weight. The thermal interface material also includes an antioxidant that is about 0.2 percent of the thermal interface material by weight and pigment that is about 1.1 percent of the thermal interface material by weight.

The di-block styrenic copolymer used in this example formulation includes polyethylene/propylene as the elastomeric (or rubber) portion. The structure is predominantly di-block and has a styrene to rubber ratio of 37 to 63. The copolymer has a high molecular weight and a glass transition temperature of −55° C.

The di-block/tri-block styrenic copolymer blend used in this example formulation includes polyethylene/butylene as the elastomeric (or rubber) portion. The blend is 30 percent tri-block and 70 percent di-block and has a styrene to rubber ratio of 30 to 70. The copolymer blend has a low molecular weight and a glass transition temperature of −55° C.

For this example formulation, the thermally conductive fillers include two different thermally conductive fillers. The first thermally conductive filler is aluminum (Al) with a mean particle size of 5 microns and is about 27.6 percent of the thermal interface material by weight. The second thermally conductive filler is zinc oxide (ZnO) with a mean particle size of 0.3 microns and is about 12.7 percent of the thermal interface material by weight.

The thermal interface material of this example may be prepared and processed as described above in Example 1.

This example thermal interface material exhibited a thermal conductivity of 0.3 W/mK (as measured according to the Hot Disk method). The thermal interface material exhibited a hardness of about 28 Shore 00 (three seconds, as measured according to ASTM standard D2240-00).

In exemplary embodiments, a material (e.g., a thermal interface material, an electrically-conductive thermal insulator, an EMI absorbing thermal insulator, etc.) includes at least one filler (e.g., a thermally-conductive filler, an electrically-conductive filler, an electromagnetic interference (EMI) absorber, etc.) in a thermally reversible gel including di-block and tri-block styrenic copolymers and process oil. A ratio of the process oil to the di-block and tri-block styrenic copolymers may be within a range from 4 to 1 (4:1) to 12 to 1 (12:1). Stated differently, the ratio of the process oil to the di-block and tri-block styrenic copolymers is at least 4 to 1 but not more than 12 to 1. For example, the ratio of process oil to the di-block and tri-block styrenic copolymers may be about 4:1, 4.3:1, 4.4:1, 4.5:1, 4.6:1, 11:1, 11.1:1, 12:1, or other ratio between 4:1 to 12:1. In some exemplary embodiments, the ratio of the process oil to the di-block and tri-block styrenic copolymers may be at least 4:1 but not more than 5:1 or at least 11:1 but not more 12:1.

In some exemplary embodiments, the at least one filler comprises an electrically-conductive filler. And, the material comprises an electrically-conductive thermal insulator.

In some exemplary embodiments, the at least one filler comprises an electromagnetic interference (EMI) absorber. And, the material comprises an EMI absorbing thermal insulator.

In some exemplary embodiments, the at least one filler comprises a thermally-conductive filler. And, the material comprises a thermal interface material.

In some exemplary embodiments, the at least one filler comprises an electrically-conductive filler, an electromagnetic interference (EMI) absorber, and/or a thermally-conductive filler. For example, the filler may comprise an electrically-conductive filler, an electromagnetic interference (EMI) absorber, and a thermally-conductive filler. Alternatively, the filler may comprise only one an electrically-conductive filler, an electromagnetic interference (EMI) absorber, or a thermally-conductive filler. As yet another example, the filler may comprise any combination of an electrically-conductive filler, an electromagnetic interference (EMI) absorber, and/or a thermally-conductive filler.

The ratio of di-block styrenic copolymer to tri-block styrenic copolymer may be at least about 0.85 to 1 (0.85:1) but not more than 1.6 to 1 (1.6:1). For example, the ratio of di-block styrenic copolymer to tri-block styrenic copolymer may be about 0.85:1, 1:1, 1.2:1, 1:5.1, 1.6:1, or other ratio between 0.85:1 and 1.6:1. In some exemplary embodiments, the ratio of di-block styrenic copolymer to tri-block styrenic copolymer may be at least 1:1 but not more than 1.6:1.

The material may include at least one or more fillers and/or additives (e.g., an electrically-conductive filler, an electromagnetic interference (EMI) absorber, a thermally-conductive filler, etc.) in a total amount less than or equal to about 99 percent of the material by weight. For example, the material may include at least one or more fillers and/or additives in a total amount that is about 40 percent to about 99 percent of the material by weight (e.g., 47%, 48%, 94%, 95%, 96% by weight, etc.).

The material may have a hardness less than or equal to about 90 Shore 00 (three seconds, as measured according to ASTM standard D2240-00). For example, the material may have a hardness within a range from about 60 to about 90 Shore 00 (three seconds, as measured according to ASTM standard D2240-00), such as a hardness of 72, 80, 81, 85, etc.

In an exemplary embodiment, the ratio of the process oil to the di-block and tri-block styrenic copolymers may be about 4.5 to 1. The ratio of the di-block styrenic copolymer to the tri-block styrenic copolymer may be about 1.5 to 1. The material (e.g., a thermal interface material, an electrically-conductive thermal insulator, an EMI absorbing thermal insulator, etc.) may include at least one or more fillers and/or additives (e.g., a thermally-conductive filler, an electrically-conductive filler, an EMI absorber, etc.) in a total amount of about 94 or 95 percent of the material by weight. The material may have a hardness of about 85 Shore 00 (three seconds, as measured according to ASTM standard D2240-00).

In another exemplary embodiment, the ratio of the process oil to the di-block and tri-block styrenic copolymers may be about 11 or 11.1 to 1. The ratio of the di-block styrenic copolymer to the tri-block styrenic copolymer may be about 1.5 or 1.6 to 1. The material (e.g., a thermal interface material, an electrically-conductive thermal insulator, an EMI absorbing thermal insulator, etc.) may include at least one or more fillers and/or additives (e.g., a thermally-conductive filler, an electrically-conductive filler, an EMI absorber, etc.) in a total amount of about 94 or 95 percent of the material by weight. The material may have a hardness of about 72 Shore 00 (three seconds, as measured according to ASTM standard D2240-00).

In a further exemplary embodiment, the ratio of the process oil to the di-block and tri-block styrenic copolymers may be about 4.5 to 1. The ratio of the di-block styrenic copolymer to the tri-block styrenic copolymer may be about 1.2 to 1. The material (e.g., a thermal interface material, an electrically-conductive thermal insulator, an EMI absorbing thermal insulator, etc.) may include at least one or more fillers and/or additives (e.g., a thermally-conductive filler, an electrically-conductive filler, an EMI absorber, etc.) in a total amount of about 47 or 48 percent of the material by weight. The material may have a hardness of about 80 Shore 00 (three seconds, as measured according to ASTM standard D2240-00).

In yet another exemplary embodiment, the ratio of the process oil to the di-block and tri-block styrenic copolymers may be about 4.3 or 4.4 to 1. The ratio of the di-block styrenic copolymer to the tri-block styrenic copolymer may be about 1 to 1. The material (e.g., a thermal interface material, an electrically-conductive thermal insulator, an EMI absorbing thermal insulator, etc.) may include at least one or more fillers and/or additives (e.g., a thermally-conductive filler, an electrically-conductive filler, an EMI absorber, etc.) in a total amount of about 95 or 96 percent of the material by weight. The material may have a hardness of about 81 Shore 00 (three seconds, as measured according to ASTM standard D2240-00).

In exemplary embodiments, a material (e.g., a thermal interface material, an electrically-conductive thermal insulator, an EMI absorbing thermal insulator, etc.) includes at least one filler (e.g., a thermally-conductive filler, an electrically-conductive filler, an EMI absorber, etc.) in a thermally reversible gel including di-block and tri-block styrenic copolymers and process oil. The material may have a hardness less than or equal to about 88 Shore 00 (three seconds, as measured according to ASTM standard D2240-00). The process oil may be less than or equal to about 43.2 percent of the material by weight. The di-block styrenic copolymer may be less than or equal to about 5.3 percent of the material by weight. The material may further include at least one filler that is less than or equal to about 98 percent of the material by weight. The material may also include a di-block and tri-block styrenic copolymer blend that is less than or equal to about 10.6 percent of the material by weight. Or, the material may include tri-block styrenic copolymer that is less than or equal to about 6.7 percent of the material by weight.

In an exemplary embodiment, the material has a hardness within a range from 28 Shore 00 to 88 Shore 00 (three seconds, as measured according to ASTM standard D2240-00). The process oil (e.g., paraffinic oil, etc.) is about 13.5 percent to about 43.2 percent of the material by weight. The di-block styrenic copolymer is about 1.7 percent to about 5.3 percent of the material by weight. The at least one filler is about 40.3 percent to about 81 percent of the material by weight. The material also includes the di-block and tri-block styrenic copolymer blend that is about 3.4 percent to about 10.6 percent of the material by weight, or the tri-block styrenic copolymer that is about 1.1 percent to about 6.7 percent of the material by weight.

In some exemplary embodiments, the material may comprise a thermally-conductive gap filler that is soft at room temperature and that is operable for allowing heat generated by an operating electrical component to pass through the gap filler. The material may be free of silicone. The material may be compliant, soft at room temperature, and operable for filling a gap between thermal transfer surfaces to thereby allow heat generated by an operating electrical component to pass from one of the thermal transfer surfaces through the material to the other one of the thermal transfer surfaces. The material may be formulated to soften at a temperature of about 150 degrees Celsius. The at least one filler may comprise one or more of boron nitride, alumina, aluminum, graphite, copper, and combinations thereof. The material may include not less than 5 percent but not more than 98 percent by weight of the at least one thermally conductive filler.

The above described example formulations illustrate the variability and adaptability of materials based on thermally reversible gels. The example formulations described above illustrate that those example materials exhibit a wide range of characteristics. For example, the hardness of the final material may range from a grease (Example 4) to a hardness of 88 shore 00 (Example 5). The thermal conductivity may range from 0.3 W/mK (Example 6) to 3.37 W/mK (Example 5) in exemplary embodiments in which the material comprises a thermal interface material. It can be seen that by varying the type and percentages of the oil, gelling agent, and/or fillers, various materials having different characteristics (e.g., higher or lower thermal conductivities, higher or lower hardness ratings, etc.) may be created. It should be appreciated that numerical values and particular formulations are provided in these examples, and in this disclosure, for illustrative purposes only. The particular values and formulations provided are not intended to limit the scope of the present disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the term "and/or" includes any and all combinations of one or more of the associated listed items. Also as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms, "next," etc., when used herein, do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). Similarly, it is envisioned that disclosure of two or more ranges of values for a parameter (whether such ranges are nested, overlapping or distinct) subsume all possible combination of ranges for the value that might be claimed using endpoints of the disclosed ranges.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A material comprising at least one filler in a thermally reversible gel including di-block and tri-block styrenic copolymers and process oil, wherein a ratio of the process oil to the di-block and tri-block styrenic copolymers is at least about 4 to 1 but not more than about 12 to 1, wherein the material comprises a pad formulated to be compliant against a surface of an electrical component at room temperature and during operation of the electrical component, and wherein the material includes the at least one filler and/or one or more additives in a total amount less than or equal to about 99 percent of the material by weight.

2. The material of claim 1, wherein the ratio of the process oil to the di-block and tri-block styrenic copolymers is not more than about 5 to 1.

3. The material of claim 1, wherein the ratio of the process oil to the di-block and tri-block styrenic copolymers is at least about 11 to 1.

4. The material of claim 1, wherein the ratio of the process oil to the di-block and tri-block styrenic copolymers is about 4.5 to 1.

5. The material of claim 1, wherein a ratio of the di-block styrenic copolymer to the tri-block styrenic copolymer is at least about 0.85 to 1 but not more than about 1.6 to 1.

6. The material of claim 1, wherein a ratio of the di-block styrenic copolymer to the tri-block styrenic copolymer is at least about 1 to 1.

7. The material of claim 1, wherein:
the ratio of the process oil to the di-block and tri-block styrenic copolymers is about 4.5 to 1; and
the ratio of the di-block styrenic copolymer to the tri-block styrenic copolymer is about 1.5 to 1.

8. The material of claim 1, wherein:
the ratio of the process oil to the di-block and tri-block styrenic copolymers is about 11.1 to 1; and
the ratio of the di-block styrenic copolymer to the tri-block styrenic copolymer is about 1.5 to 1.

9. The material of claim 1, wherein:
the ratio of the process oil to the di-block and tri-block styrenic copolymers is about 4.5 to 1; and
the ratio of the di-block styrenic copolymer to the tri-block styrenic copolymer is about 1.2 to 1.

10. The material of claim 1, wherein:
the ratio of the process oil to the di-block and tri-block styrenic copolymers is about 4.4 to 1; and
the ratio of the di-block styrenic copolymer to the tri-block styrenic copolymer is about 1 to 1.

11. The material of claim 1, wherein the material includes the at least one filler and/or one or more additives in a total amount that is at least about 40 percent but not more than about 99 percent of the material by weight.

12. The material of claim 1, wherein the material has a hardness less than or equal to about 90 Shore 00.

13. The material of claim 1, wherein the material has a hardness of at least 60 Shore 00 but not more than about 90 Shore 00.

14. The material of claim 1, wherein:
a ratio of the di-block styrenic copolymer to the tri-block styrenic copolymer is at least about 0.85 to 1 but not more than about 1.6 to 1;
the material includes the at least one filler and/or one or more additives in a total amount that is about 40 percent to about 99 percent of the material by weight; and
the material has a hardness that is at least about 60 Shore 00 but not more than 90 Shore 00.

15. The material of claim 1, wherein the at least one filler comprises an electrically-conductive filler.

16. The material of claim 15, wherein the material comprises an electrically-conductive thermal insulator.

17. The material of claim 1, wherein the at least one filler comprises an electromagnetic interference (EMI) absorber.

18. The material of claim 17, wherein the material comprises an EMI absorbing thermal insulator.

19. The material of claim 1, wherein the at least one filler comprises a thermally-conductive filler.

20. The material of claim 19, wherein the material comprises a thermal interface material.

21. The material of claim 1, wherein the at least one filler comprises an electrically-conductive filler, an electromagnetic interference (EMI) absorber, and/or a thermally-conductive filler.

22. A material comprising at least one filler in a thermally reversible gel including di-block and tri-block styrenic copolymers and process oil, wherein:
the material comprises a pad formulated to be compliant against a surface of a device at room temperature and during operation of the device; and
the material is silicone free, such that the material is usable with no occurrence of silicone migration or volatility due to the absence of silicone in the formulation.

23. A material comprising at least one filler in a thermally reversible gel including di-block and tri-block styrenic copolymers and process oil, wherein the material comprises a pad formulated to be compliant against a surface of a device at room temperature and during operation of the device.

24. The material of claim 23, wherein:

the material has a hardness less than or equal to about 88 Shore 00;

the process oil is less than or equal to about 43.2 percent of the material by weight;

the di-block styrenic copolymer is less than or equal to about 5.3 percent of the material by weight;

a di-block and tri-block styrenic copolymer blend is less than or equal to about 10.6 percent of the material by weight, or the tri-block styrenic copolymer is less than or equal to about 6.7 percent of the material by weight; and the at least one filler is less than or equal to about 98 percent of the material by weight.

* * * * *